(12) United States Patent
Yagi et al.

(10) Patent No.: US 9,123,455 B2
(45) Date of Patent: Sep. 1, 2015

(54) CONNECTION STRUCTURE FOR SUPERCONDUCTING CABLES

(71) Applicants: FURUKAWA ELECTRIC CO., LTD., Tokyo (JP); INTERNATIONAL SUPERCONDUCTIVITY TECHNOLOGY CENTER, Kanagawa (JP)

(72) Inventors: Masashi Yagi, Tokyo (JP); Tomoya Nomura, Tokyo (JP); Hirao Hirata, Tokyo (JP); Takaharu Mitsuhashi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/236,605

(22) PCT Filed: Apr. 15, 2013

(86) PCT No.: PCT/JP2013/061162
§ 371 (c)(1),
(2) Date: Jan. 31, 2014

(87) PCT Pub. No.: WO2013/157513
PCT Pub. Date: Oct. 24, 2013

(65) Prior Publication Data
US 2015/0031546 A1    Jan. 29, 2015

(30) Foreign Application Priority Data
Apr. 19, 2012  (JP) .................... 2012-095482

(51) Int. Cl.
| | | |
|---|---|---|
| H01L 39/00 | (2006.01) | |
| H01B 12/02 | (2006.01) | |
| H01R 4/68 | (2006.01) | |
| H01B 7/02 | (2006.01) | |
| H02G 15/34 | (2006.01) | |
| H01L 39/02 | (2006.01) | |

(52) U.S. Cl.
CPC .............. *H01B 12/02* (2013.01); *H01B 7/0241* (2013.01); *H01R 4/68* (2013.01); *H01L 39/02* (2013.01); *H02G 15/34* (2013.01); *Y02E 40/648* (2013.01)

(58) Field of Classification Search
CPC . H01L 39/248; H01L 39/143; H01L 39/2419; H01B 12/16
See application file for complete search history.

(56) References Cited

FOREIGN PATENT DOCUMENTS

| | | |
|---|---|---|
| JP | 4112698 | 6/1966 |
| JP | S4895586 | 12/1973 |
| JP | S58204713 | 11/1983 |

(Continued)

OTHER PUBLICATIONS

"Shinpan Denryoku Keburu Gijutsu Handobukku (New Edition Power Cable Technology Handbook)", edited by Kihachiro Iizuka, Denkishoin Co., Ltd. pp. 429-430, Mar. 4, 1989.

(Continued)

*Primary Examiner* — Colleen Dunn
(74) *Attorney, Agent, or Firm* — Amin, Turocy & Watson, LLP

(57) ABSTRACT

A connection structure for superconducting cables includes: superconducting cables that are connected to each other and include cable cores containing formers and superconducting conductor layers, and each cable core is housed in a thermal insulation tube with a cooling medium, wherein the cable cores include electric insulating layers obtained by winding insulating sheets around the superconducting conductor layers, the electric insulating layers on both sides of a conductor connecting part, in which the formers and the superconducting conductor layers are connected to each other, include taper shape portions each having a diameter reducing towards the conductor connecting part, each taper shape portion is formed so as to have an inclination angle changing in a stepwise fashion by a plurality of tapered portions among which a tapered portion nearer the conductor connecting part has smaller inclination angle, and a reinforcing insulating layer is provided between the taper shape portions.

8 Claims, 10 Drawing Sheets

(56) References Cited

FOREIGN PATENT DOCUMENTS

| | | |
|---|---|---|
| JP | S6142208 | 2/1986 |
| JP | 2011045169 | 3/2011 |

OTHER PUBLICATIONS

International Search Report for PCT Application Serial No. PCT/JP2013/061162, mailed Jun. 11, 2013, 4 pages.

International Preliminary Report on Patentability for PCT Application No. PCT/JP2013/061162, mailed Oct. 21, 2014, 13 pages.

CONNECTION STRUCTURE FOR SUPERCONDUCTING CABLES

CROSS-REFERENCE TO RELATED APPLICATIONS

This application is a U.S. National Stage application of PCT Patent Application No. PCT/JP2013/061162, filed Apr. 15, 2013 and entitled "CONNECTION STRUCTURE FOR SUPERCONDUCTING CABLE"; which claims priority to Japanese Patent Application No. 2012-095482, filed Apr. 19, 2012. The entireties of the above-referenced applications are incorporated herein by reference.

TECHNICAL FIELD

The present invention relates to a connection structure for superconducting cables for transmitting electrical power.

BACKGROUND ART

Heretofore, there is known a superconducting cable using superconducting wire material as a conductor, which material becomes a superconducting state at an ultralow temperature. The superconducting cable is expected to serve as a power cable capable of transmitting large current with low loss, and is being developed for practical use.

The superconducting cable has a structure in which a cable core is housed in a thermal insulation tube, and the cable core is constructed by laminating a former, a superconductive conductor layer, an electric insulating layer, etc. in order from the center of the cable core.

The thermal insulation tube has a double tube structure having an internal tube and an external tube, wherein vacuum evacuation is performed between the internal tube and the external tube, and a cooling medium such as liquid nitrogen circulates inside the internal tube so that electrical power is transmitted in an ultralow temperature state.

Because the above-described superconducting cable is made to have a predetermined length, it is necessary to connect ends of the cables to each other with an intermediate connecting part in the case that the superconducting cable needs to be laid over a distance longer than the length of the superconducting cable.

In the intermediate connecting part, a connecting technique for an oil impregnated insulation cable (oil-filled (OF) cable) having a similar insulated structure is applied to a cable core connection. Concretely, as illustrated in FIG. 17, in each superconducting cable to be connected, insulating paper is formed in a taper shape by being exposed in a penciling form (pencil-like shape), the insulating paper constituting an electrical insulating portion outside a superconductive conductor 101.

Then, after connecting superconductive conductors to each other, an electric insulating portion 103 is newly formed by winding new insulating paper between taper shape portions of one electric insulating portion 102 and the other electric insulating portion 102 which are exposed in the penciling form and face each other, further a reinforcing insulating portion 104 which reinforces the insulating portions is formed by winding insulating paper around the periphery of the electric insulating portion 103 so that the reinforcing insulating portion 104 has a larger diameter than that of the existing insulating portions 102, and thereby the intermediate connecting part is insulated (for example, see non-patent document 1).

PRIOR ART DOCUMENT

Non-Patent Document

Non Patent Document 1: "Shinpan Denryoku Keburu Gijutsu Handobukku (New Edition Power Cable Technology Handbook)", edited by Kihachiro Iizuka, Denkishoin Co., Ltd., pp. 429-430, Mar. 4, 1989

SUMMARY OF THE INVENTION

Problems to be Solved by the Invention

Meanwhile, in the case of the OF cable, a valley between the taper shape portions of the electric insulating portions facing each other is filled by using insulating paper impregnated with oil. For this reason, the insulating paper is wound while being squeezed, which enables forming the insulating portions so that they are attached firmly to each other while preventing looseness thereof.

On the other hand, in the case of the superconducting cable, because the cooling medium is supplied to an area surrounding the cable core, a valley between the taper shape portions of the electric insulating portions facing each other is filled by using dry insulating paper. The dry insulating paper is likely to be torn when it is wound while being squeezed, so it is wound relatively loosely.

This causes a problem that adhesion between an original insulating portion and a newly formed insulating portion for filling the valley is weakened in each taper shape portion, and thereby resistance to electrical gradient (resistance to electrical field stress) in a stratabound direction along a taper surface of the taper shape portion is decreased.

The resistance to electrical field stress becomes larger toward the inner side, which is near the superconductive conductor, but the adhesion becomes weaker and a gap is more easily formed toward the inner side of the electric insulating portion because the inner side thereof shrinks in not only a longitudinal direction but also a radial direction as the conductor is cooled from an ambient temperature to −200 degrees C., which has been a problem because it further reduces electrical performance of the intermediate connecting part.

An object of the present invention is to improve the resistance to electrical field stress in the taper shape portion in the intermediate connecting part of the superconducting cable.

Means for Solving the Problems

In order to achieve the object, the present invention has the feature of a connection structure for superconducting cables including: superconducting cables that are connected to each other and include cable cores containing formers and superconducting conductor layers, respectively, and each of the cable cores is housed in a thermal insulation tube with a cooling medium, wherein the cable cores include electric insulating layers obtained by winding insulating sheets around the superconducting conductor layers, respectively, the electric insulating layers on both sides of a conductor connecting part, in which the formers and the superconducting conductor layers are connected to each other, include taper shape portions each having a diameter reducing towards the conductor connecting part, each of the taper shape portions is formed so as to have an inclination angle changing in a stepwise fashion by a plurality of tapered portions among which a tapered portion nearer the conductor connecting part has smaller inclination angle, and a reinforcing insulating layer is provided between the taper shape portions.

Moreover, the present invention may have a configuration where each of the taper shape portions includes a step portion whose outer diameter is constant, at a boundary position between the tapered portions having inclination angles that change in a stepwise fashion.

Furthermore, the present invention may have a configuration where the reinforcing insulating layer is composed of a plurality of layers which are laminated in order from an inner side, and each of the layers is formed by winding the insulating sheet until an outer diameter of each of the layers becomes same as the outer diameter of the step portion, and each of the layers laminated in order is formed by winding the insulating sheet so as to cover a boundary between a layer positioned on the inner side among the laminated layers and the step portion having the same outer diameter as the outer diameter of the inner side layer.

Moreover, the present invention may have a configuration where the reinforcing insulating layer is composed of a plurality of layers which are laminated in order from the inside, and each of the layers is composed of an insulating layer having a wide width in a longitudinal direction of the superconducting cable and an insulating layer having a narrow width and fulfilling gaps existing on both sides of the wide-width insulating layer, and the wide-width insulating layer is formed so as to cover an entire outer periphery of the narrow-width insulating layer positioned on the inner side.

Furthermore, the present invention may have a configuration where a length of the step portion in a cable longitudinal direction is 20 [mm] or more but 100 [mm] or less.

Moreover, the present invention may have a configuration where when a tapered portion nearest the conductor connecting part among the tapered portions of the taper shape portion is defined as a first one, inclination angles $\alpha_1$ to $\alpha_n$ of the tapered portions from first one to $n^{th}$ one fulfill a condition of the following formula.

[Formula 1]

[FIRST STEP] (7)

$$\frac{A \cdot \sin\alpha_1}{y} < 1 (r \leq y < Y_1),$$

$$y = r + x \cdot \tan\alpha_1 (0 \leq x < X_1)$$

[SECOND STEP] (8)

$$\frac{A \cdot \sin\alpha_2}{y} < 1 (Y_1 \leq y < Y_2),$$

$$y = r + X_1 \tan\alpha_1 + (x - X_1)\tan\alpha_2 (X_1 \leq x < X_2)$$

[THIRD STEP] (9)

$$\frac{A \cdot \sin\alpha_3}{y} < 1 (Y_2 \leq y < Y_3),$$

$$y = r + X_1 \tan\alpha_1 + (X_2 - X_1)\tan\alpha_2 + (x - X_2)\tan\alpha_3 (X_2 \leq x < X_3)$$

⋮

[Nth STEP] (10)

$$\frac{A \cdot \sin\alpha_1}{y} < 1 (Y_{n-1} \leq y < Y_n),$$

$$y = r + \sum_{K=1}^{n-1}(X_K - X_{K-1})\tan\alpha_K + (x - X_{n-1})\tan\alpha_n (X_{n-1} \leq x < X_n)$$

WHERE (11)

$$\frac{A \cdot \sin\alpha_1}{y} = 1$$

-continued $$\theta = \tan^{-1}\left[(R - r) \cdot \frac{g_x}{V} \cdot \frac{\ln\left(\frac{R_j}{r}\right)}{\ln\left(\frac{R}{r}\right)}\right] \quad (12)$$

wherein R is a radius of an outer periphery of the electric insulating layer, r is a radius of an outer periphery of the superconducting conductor layer, $R_j$ is a radius of the outer periphery of the reinforcing insulating layer, θ is an inclination angle obtained from target withstand voltage V of the superconducting conductor layer, destruction strength $g_x$ of a taper surface in the stratabound-direction, and values of above R, $R_j$ and r when hypothetically assuming that the taper shape portion is made of a single tapered portion, x is a variable indicating a position on a line along a cable longitudinal direction with a tip portion of the taper shape portion as an origin, y is a variable indicating a position on a line towards outside in a radius direction with a cable centerline as an origin, and $X_{1\ to\ n}$ and $Y_{1\ to\ n}$ are positional coordinates of maximum diameters of the tapered portions from the first one to $n^{th}$ one on a plane with x-y coordinate system.

Moreover, the present invention may have a configuration where the number n of the tapered portions is 2 or 3.

Furthermore, the present invention may have a configuration where a maximum value among stratabound-direction stresses in the plurality of tapered portions arises in an outermost tapered portion among the tapered portions.

Additionally, the present invention may have a configuration where a value of stratabound-direction stress in a tip portion of each of the tapered portions becomes lower as each of the tapered portions is placed on inner side.

Advantageous Effects of the Invention

The present invention forms the taper shape portions in the electric insulating layers at both sides of the conductor connecting part, respectively, and each of the taper shape portions is formed so that its inclination angle changes in a stepwise fashion by including a plurality of tapered portions, among which the tapered portion nearer the conductor connecting part has smaller inclination angle.

While electrical field stress in the electric insulating layer becomes larger toward the superconductive conductor layer on the inner side, in the tip portion of the taper shape portion, insulation performance is likely to be lowered along the stratabound direction of the taper surface because the superconductive conductor layer on the inner side shrinks by being cooled with the cooling medium.

However, according to the present invention, because the inclination angles of each taper shape portion are made so that the inclination angles nearer the front edge (having a smaller diameter) of the taper shape portion are smaller than the inclination angles nearer the posterior edge (having a larger diameter) of the taper shape portion, stratabound-direction components of electrical field stress can be reduced, and thereby occurrence of electrical breakdown in the stratabound direction can be suppressed.

Moreover, because the taper shape portion has the inclination angles which become larger in a stepwise fashion with increasing distance from the conductor connecting part, the overall length of the taper portion can be reduced in comparison with the case of reducing the inclination angle of the whole taper shape portion, and thereby connection structure can be downsized and the workload necessary for forming it and/or production time can be reduced.

Furthermore, because in the case of forming the step portion in the taper shape portion, the insulating sheets can be also wound around the outer periphery of the step portion, adhesion becomes high in comparison with the case of winding it around the tapered portion, insulation performance between the taper shape portion and the reinforcing insulating layer can be prevented from being lowered, and thereby it becomes possible to provide the intermediate connection having excellent insulation performance.

Moreover, because the boundary between the insulating layers is covered with the insulating layer that is further laminated on the insulating layers in the case that the reinforcing insulating layer is composed of the plural layers laminated in order from the inner side, the laminated layers are composed of the wide-width insulating layer and the narrow-width insulating layer, and the wide-width insulating layer is formed so as to cover the entire outer periphery of the narrow-width insulating layer, and thereby the insulation performance at the boundary can be prevented from being lowered and it becomes possible to provide the intermediate connection having excellent insulation performance.

BEST MODE FOR CARRYING OUT THE INVENTION

First Embodiment

Hereinafter, a first embodiment will be described with reference to the drawings.

Figure 1:
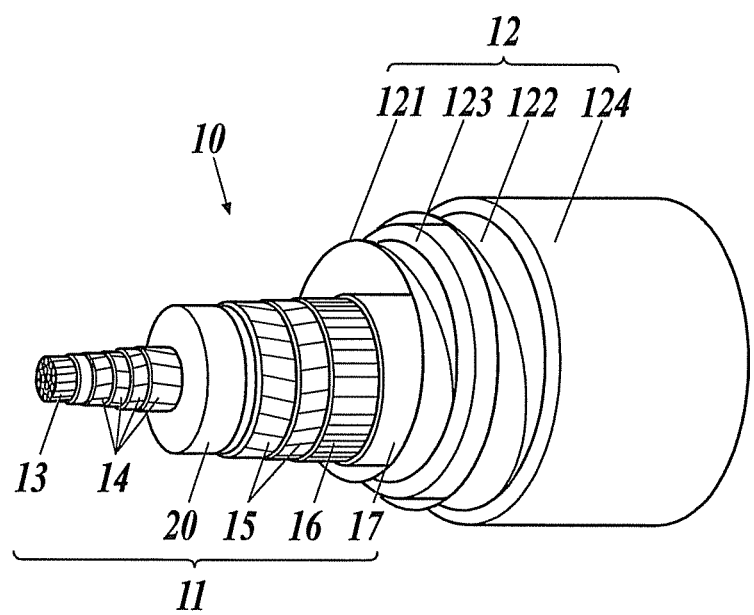
FIG. 1 is a diagram illustrating an example of a superconducting cable.
Figure 2:
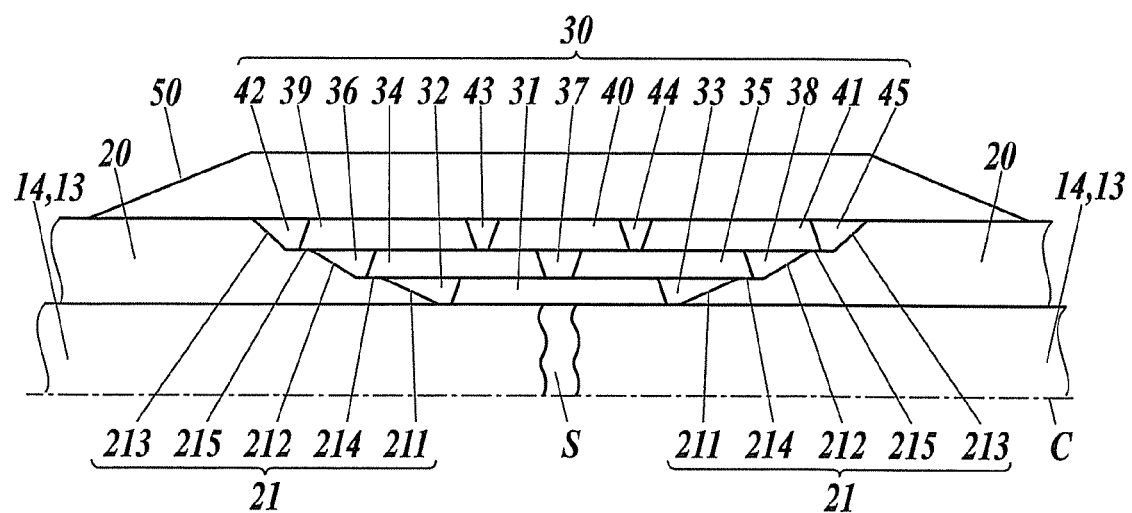
FIG. 2 is a cross-sectional view illustrating a major connection structure of a cable core in an intermediate connecting part of the superconducting cable.

FIG. 1 is a diagram illustrating an example of superconducting cable to be laid, and FIG. 2 is a cross-sectional view illustrating a major connection structure of a cable core in an intermediate connecting part of the superconducting cable.

[Superconducting Cable]

The superconducting cable 10 illustrated in FIG. 1 is a single-core-type superconducting cable in which a single-core cable core 11 is housed in a thermal insulation tube 12. The cable core 11 is composed of a former 13, superconductive conductor layers 14, an electric insulating layer 20, superconducting shield layers 15, a normal conducting shield layer 16, a protecting layer 17, etc.

The former 13 is a core for winding, which is used to form the cable core 11, and for example, constructed by twisting a normal conducting wire such as a copper wire. Into the former 13, fault current flowing through the superconductive conductor layers 14 upon short circuit is branched.

The superconductive conductor layers 14 are formed by winding a plurality of superconducting wire materials spirally on the outer periphery of the former 13. In FIG. 1, the superconductive conductor layers 14 have a laminated structure of four layers. An electrical transmission current flows through the superconductive conductor layers 14 during a steady operation.

The superconducting wire material constituting the superconductive conductor layers 14 has, for example, a laminated structure in which an intermediate layer, a superconducting layer, a protecting layer, etc. are laminated in order on a tape-shaped metal substrate. As a superconductor constituting the superconducting layer, a RE-based superconductor (RE: rare earth element) showing superconductivity at a liquid nitrogen temperature or more, for example, yttrium-based superconductor (Y-based superconductor, hereinafter) expressed as the chemical formula $YBa_2Cu_3O_{7-y}$ is typical. In addition, a tape-shaped superconducting wire material in which a superconductor is formed in a metal matrix may be used. As the superconductor, a bismuth-based superconductor, for example, expressed by the chemical formula $Bi_2Sr_2CaCu_2O_{8+\delta}$ (Bi2212), or $Bi_2Sr_2Ca_2Cu_3O_{10+\delta}$ (Bi2223) can be used.

Incidentally, δ indicates a nonstoichiometric amount of oxygen in the chemical formula.

The electric insulating layer 20 may be made of insulating sheets, for example, an insulating paper, a semi-synthesized paper obtained by joining an insulating paper and a polypropylene film, a polymer non-woven tape, etc., but herein a case of using the insulating paper is illustrated. Concretely, the electric insulating layer 20 is formed to be a laminated state by winding the insulating paper around the outer periphery of the superconductive conductor layers 14.

The superconducting shield layers 15 are formed by winding a plurality of superconducting wire materials spirally on the outer periphery of the electric insulating layer 20. In FIG.

1, the superconducting shield layers 15 have a laminated structure of two layers. Substantially the same current as conductor current flowing through the superconductive conductor layers 14 flows through the superconducting shield layers 15 in opposite phase by an electromagnetic induction during a steady operation. As the superconducting wire materials constituting the superconducting shield layers 15, superconducting wire materials similar to those for the superconductive conductor layers 14 may be used, or alternatively different kinds of superconducting wire materials may be used.

The normal conducting shield layer 16 is formed by winding a normal conducting wire such as a copper wire on the outer periphery of the superconducting shield layers 15. Into the normal conducting shield layer 16, fault current flowing through the superconducting shield layers 15 upon short circuit is branched.

The protecting layer 17 is made of an insulating paper, a polymer non-woven fabric, etc. for example, and formed by winding it around the outer periphery of the normal conducting shield layer 16.

The thermal insulation tube 12 has a double tube structure constituted of a thermal insulation internal tube 121 in which the cable core 11 is housed and which is filled with a cooling medium (liquid nitrogen, for example), and a thermal insulation external tube 122 which is provided so as to cover the outer periphery of the internal tube 121.

The thermal insulation internal tube 121 and the thermal insulation external tube 122 are, for example, stainless steel corrugated tubes (waved tubes). Between the thermal insulation internal tube 121 and the thermal insulation external tube 122, a multilayer thermal insulator (Super Insulation) 123 formed by a laminated body of polyethylene films on which aluminum is deposited, for example, is interposed, and a region therebetween is maintained in a vacuum state. In addition, the outer periphery of the thermal insulation external tube 122 is covered by a corrosion-resistant layer 124 of polyvinyl chloride (PVC), polyethylene, or the like.

[Connection Structure of Intermediate Connecting Part: Summary]

When connecting the superconducting cables 10 to each other, a not-illustrated fixing box that connects the thermal insulation tubes 12 to each other is used. The fixing box has a double wall surface structure similarly to the thermal insulation tubes 12, in which vacuum evacuation is performed between the wall surfaces and a cooling medium circulates inside the box. In the box, the cable cores 11 of the superconducting cables 10 are connected to each other.

When connecting the cable cores 11 to each other, components other than the formers 13 are displaced to rearward positions from connection ends first, the formers 13 are placed opposite and the connection ends are welded to each other, then shape forming is performed so that an external diameter of a welded part of the formers 13 becomes uniform, and after that, the superconductive conductor layers 14 which have been displaced to the rearward positions from the connection ends are rewound around the former 13.

Then, on the upper surfaces (outer peripheries) in the connection ends of two superconductive conductor layers 14, superconducting wire material (not illustrated) for connection is attached in the bridging state, with solder interposed, so as to enable conduction between the superconducting layers of the respective superconductive conductor layers 14, and thereby the superconductive conductor layers 14 are electrically connected to each other. Incidentally, it is also possible to connect directly the superconducting wire materials constituting the superconducting layers of the superconductive conductor layers 14 to each other one by one with solder.

[Connection Structure of Electric Insulating Layers]

Figure 3:
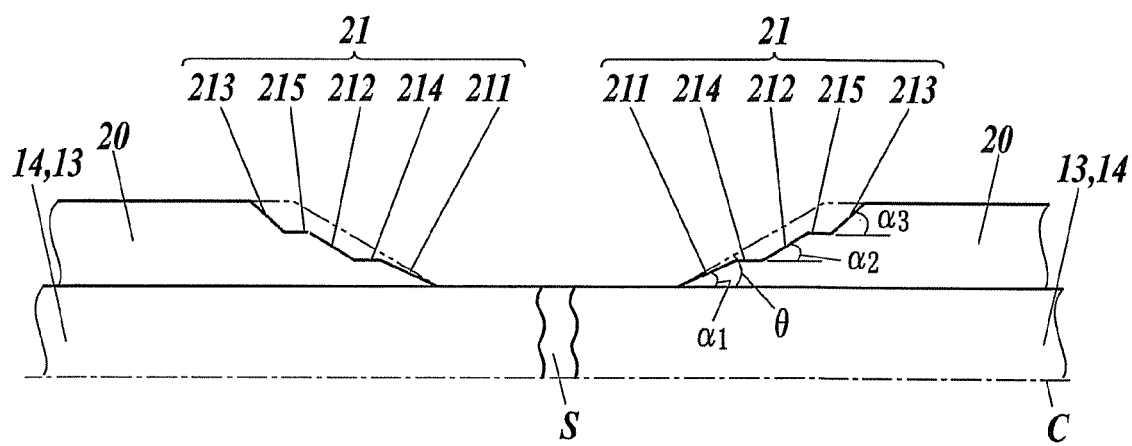
FIG. 3 is a cross-sectional view illustrating a state that formers and superconductive conductor layers are connected to each other and first and second reinforcing insulating layers are incomplete.

Next, the electric insulating layers 20 will be described with reference to FIG. 2 and FIG. 3. FIG. 3 is a cross-sectional view illustrating a state that the formers 13 and the superconductive conductor layers 14 are connected to each other and after-mentioned first and second reinforcing insulating layers 30, 50 are incomplete. In FIG. 2 and FIG. 3, mark S indicates a conductor connecting part of the former 13 and the superconductive conductor layer 14.

As illustrated in FIG. 3, each of the electric insulating layers 20 of the cable cores 11 has a taper shape portion 21 whose diameter is reduced in a stepwise fashion towards the conductor connecting part S. The diameter of the taper shape portion 21 is reduced by three steps, and the electric insulating layer 20 is not formed on the outer periphery of the conductor connecting part S. Thus, the taper shape portion 21 includes, as a plurality of taper portions whose inclination angles change in a stepwise fashion, a first tapered portion 211 having a smallest outer diameter (nearest the conductor connecting part S), a second tapered portion 212 having a second smallest outer diameter (second nearest the conductor connecting part S), and a third tapered portion 213 having a largest diameter (farthest from the conductor connecting part S). Between the first tapered portion 211 and the second tapered portion 212, a first equal diameter portion 214 whose outer diameter is constant is formed as a step portion, and between the second tapered portion 212 and the third tapered portion 213, a second equal diameter portion 215 whose outer diameter is constant is formed as a step portion.

The taper surfaces of the respective tapered portions 211, 212, 213 are formed by cutting off side ends of the wound insulating paper.

A magnitude relation among inclination angles $\alpha_1$, $\alpha_2$, $\alpha_3$ of the respective taper surfaces of the first tapered portion 211, the second tapered portion 212, and the third tapered portion 213 with respect to a cable centerline C is $\alpha_1 < \alpha_2 < \alpha_3$.

[Reinforcing Insulating Layer]

In a valley portion between the taper shape portions 21, 21 facing each other, as illustrated in FIG. 2, a first reinforcing insulating layer 30 is formed so as to fill the valley portion, and on the outer periphery of the first reinforcing insulating layer 30, a second reinforcing insulating layer 50 is formed so as to cover the end of the first reinforcing insulating layer 30 and the ends of the electric insulating layers 20 including the taper shape portions 21, 21.

The first reinforcing insulating layer 30 is composed of three layers with the outer diameters of the first and second equal diameter portions 214, 215 in the taper shape portions 21 as the boundaries of the layers.

Concretely, the innermost layer of the first reinforcing insulating layer 30 is composed of three divided layers 31, 32, 33 which are formed within a range from the outer diameter of the superconductive conductor layer 14 to the outer diameter of the first equal diameter portion 214.

The divided layer 31 is formed by winding slop paper on the outer periphery of the superconductive conductor layer 14 until the outer diameter becomes equal to that of the first equal diameter portion 214. The slope paper is wide-width insulating paper whose both ends are previously cut with a slope in a longitudinal direction, and when being wound, it can form a taper shape at its ends so that the cross-section becomes approximately isosceles trapezoidal shape. The divided layer 31 is formed to have a width which can cover at least the conductor connecting part S by itself.

The divided layers 32, 33 are formed so as to fill gap regions between each of both ends of the divided layer 31 and each of the first tapered portions 211, 211, by winding belt-like insulating paper having a narrower width than that of the insulating paper of the electric insulating layer 20.

Incidentally, the width of the slope paper may be about 200 to 500 mm, the width of the insulating paper of the electric insulating layer 20 may be about 20 to 30 mm, and the width of the insulating paper of the divided layer 31 may be about 8 to 12 mm.

Moreover, the width (average width of upper and lower sides of trapezoidal cross-section) of the divided layer 31 in the direction along the centerline C is broader than that of each of the divided layers 32, 33, the divided layer 31 functions as a wide-width insulating layer, and the divided layers 32, 33 function as narrow-width insulating layers.

The second layer from the inner side of the first reinforcing insulating layer 30 is composed of five divided layers 34 to 38 which are formed within a range from the outer diameter of the first equal diameter portion 214 to the outer diameter of the second equal diameter portion 215.

The divided layer 34 is formed so as to bridge between the outer periphery of one first equal diameter portion 214 and the outer periphery of the divided layer 31 by winding the slope paper on the outer peripheries of the first equal diameter portion 214 and the divided layer 31 until the outer diameter thereof becomes equal to that of the second equal diameter portion 215. Thus, the divided layer 34 completely covers the boundary between the divided layer 31 and the divided layer 32 and the boundary between the divided layer 32 and the first equal diameter portion 214.

The divided layer 35 is formed so as to bridge between the outer periphery of the other first equal diameter portion 214 and the outer periphery of the divided layer 31 by winding the slope paper on the outer peripheries of the first equal diameter portion 214 and the divided layer 31 until the outer diameter thereof becomes equal to that of the second equal diameter portion 215. Thus, the divided layer 35 completely covers the boundary between the divided layer 31 and the divided layer 33 and the boundary between the divided layer 33 and the first equal diameter portion 214.

The divided layers 36, 37, 38 are formed so as to fill a gap region between one second tapered portion 212 and the divided layer 34, a gap region between the divided layer 34 and the divided layer 35, and a gap region between the divided layer 35 and the other second tapered portion 212, respectively, by winding belt-like insulating paper having a narrow width therearound.

Moreover, each width (each average width of upper and lower sides of trapezoidal cross-section) of the divided layers 34, 35 in the direction along the centerline C is broader than that of each of the divided layers 36, 37, 38, thus the divided layers 34, 35 function as wide-width insulating layers and the divided layers 36, 37, 38 function as narrow-width insulating layers.

The outermost layer of the first reinforcing insulating layer 30 is composed of seven divided layers 39 to 45 which are formed within a range from the outer diameter of the second equal diameter portion 215 to the outer diameter of the electric insulating layer 20.

The divided layer 39 is formed so as to bridge between the outer periphery of one second equal diameter portion 215 and the outer periphery of the divided layer 34 by winding the slope paper on the outer peripheries of the second equal diameter portion 215 and the divided layer 34 until the outer diameter thereof becomes equal to that of the electric insulating layer 20. Thus, the divided layer 39 completely covers the boundary between the divided layer 34 and the divided layer 36 and the boundary between the divided layer 36 and the second equal diameter portion 215.

The divided layer 40 is formed so as to bridge between the outer periphery of the divided layer 34 and the outer periphery of the divided layer 35 by winding the slope paper on the outer peripheries of the divided layer 34 and the divided layer 35 until the outer diameter thereof becomes equal to that of the electric insulating layer 20. Thus, the divided layer 40 completely covers the boundary between the divided layer 34 and the divided layer 37 and the boundary between the divided layer 37 and the divided layer 35.

The divided layer 41 is formed so as to bridge between the outer periphery of the divided layer 35 and the outer periphery of the other second equal diameter portion 215 by winding the slope paper on the outer peripheries of the divided layer 35 and the other second equal diameter portion 215 until the outer diameter thereof becomes equal to that of the electric insulating layer 20. Thus, the divided layer 41 completely covers the boundary between the divided layer 35 and the divided layer 38 and the boundary between the divided layer 38 and the second equal diameter portion 215.

The divided layers 42, 43, 44, 45 are formed so as to fill a gap region between one third tapered portion 213 and the divided layer 39, a gap region between the divided layer 39 and the divided layer 40, a gap region between the divided layer 40 and the divided layer 41, and a gap region between the divided layer 41 and the other third tapered portion 213, respectively, by winding belt-like insulating paper having a narrow width therearound.

Moreover, each width (each average width of upper and lower sides of trapezoidal cross-section) of the divided layers 39 to 41 in the direction along the centerline C is broader than that of each of the divided layers 42 to 45, thus the divided layers 39 to 41 function as wide-width insulating layers and the divided layers 42 to 45 function as narrow-width insulating layers.

Incidentally, the divided layers 31, 34, 35, 39, 40, 41 may be formed by winding not the slope paper, but the narrow-width belt-like insulating paper therearound, similarly to the divided layers 32, 33, 36, 37, 38, 42, 43, 44, 45.

The second reinforcing insulating layer 50 is formed so that the cross-section thereof becomes approximately isosceles trapezoidal shape, as illustrated in FIG. 2, by winding the slope paper, from one end thereof, around the outer peripheries of the first reinforcing insulating layer 30 and the electric insulating layers 20, the slope paper being wide-width insulating paper whose both ends are previously cut with a slope in a longitudinal direction and capable of forming a taper shape at both ends thereof when being wound. The slope paper having a wider-width end, from which winding is started, at least than the outermost periphery of the first reinforcing insulating layer 30 is used, and it is wound so that the first reinforcing insulating layer 30 is completely covered.

[Taper Shape Portion]

The taper shape portion 21 will be more concretely described.

First, "the inclination angle in the tapered portion" is defined.

Figure 4:
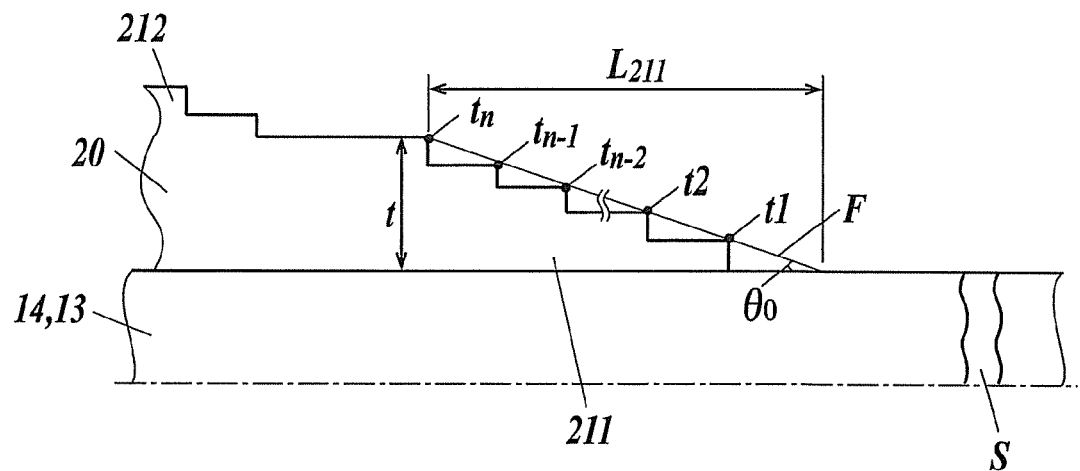
FIG. 4 is a diagram for explaining about an inclination angle of the taper shape portion.

As illustrated in FIG. 4, when a length of tapered portion 211 (though the first tapered portion 211 is illustrated, the same can be said for the second and third tapered portions 212, 213) in the direction along the centerline is defined as $L_{211}$ and a thickness of the insulating paper at the maximum outer diameter portion of the first tapered portion 211 is defined as t, inclination angle $\theta_0$ of the taped portion 211 is defined by following formula (1).

[Formula 2]

$$\theta_0 = \tan^{-1} \frac{t}{L_{211}} \tag{1}$$

In other words, the inclination angle of the taper portion 211 means, when vertexes t1 to tn of side ends of pieces of laminated insulating paper are arranged in a straight line and the straight line is defined as a baseline F, an angle between the baseline F and the cable.

In the case that all vertexes are not arranged in a straight line, for example, a straight line that connects vertex t1 at the lowermost part and vertex t5 at the uppermost part may be defined as the baseline F, or alternatively, the baseline F may be obtained by least squares method based on vertexes t1 to tn.

These is described the method for determining inclination angle θ of the taper shape portion in "Shinpan Denryoku Keburu Gijutsu Handobukku (New Edition Power Cable Technology Handbook)", edited by Kihachiro Iizuka, Denkishoin Co., Ltd., pp. 429-430. Incidentally, the above determining method is, unlike the case of the above-described taper shape portion 21 which includes the plural tapered portions having the different inclination angles, a method for determining an entirely uniform taper shape portion (hereinafter referred to as 21X) having inclination angle θ. The method for determining this inclination angle θ will be described with reference to FIG. 5. The inclination angle θ indicates an upper limit which can suppress electrical breakdown under the following condition.

In the taper shape portion 21X, x indicates a displacement in a cable longitudinal direction with a tip portion of the taper shape portion 21X as an origin, y indicates a displacement in a cable radial direction centered on the cable centerline C, R indicates a radius of the outer periphery of the electric insulating layer 20X, r indicates a radius of the outer periphery of the superconductive conductor layer 14X, $R_j$ indicates a radius of the outer periphery of the second reinforcing insulating layer 50X, and L indicates a length of the taper shape portion 21X in the centerline direction. Moreover, in FIG. 5, mark 13X indicates a former existing inside the superconductive conductor layer 14X, mark 30X indicates the first reinforcing insulating layer formed so as to fill a valley portion between the taper shape portions 21X, 21X, and mark 50X indicates the second reinforcing insulating layer formed so as to cover the end of the first reinforcing insulating layer 30X and the ends of the second reinforcing insulating layers 20X, 20X.

Following formula (2) is true between the displacement x and each parameter when a target withstand voltage is defined as V and a destruction strength in a stratabound direction (direction along the inclination angle of the tapered portion) of the tapered portion of the taper shape portion 21X is defined as $g_x$. Moreover, when displacement y is set so that y=R in the formula (2), following formula (3) is true.

[Formula 3]

$$x = \frac{V}{g_x} \cdot \frac{\ln\left(\frac{y}{r}\right)}{\ln\left(\frac{R_j}{r}\right)} \tag{2}$$

$$x = \frac{V}{g_x} \cdot \frac{\ln\left(\frac{R}{r}\right)}{\ln\left(\frac{R_j}{r}\right)} \tag{3}$$

For example, while setting x so that x=L, the values of target withstand voltage: V=1260 [kV], destruction strength in a stratabound direction: $g_x$=3 [kV/mm], r=17.7 [mm], R=39.7 [mm] and $R_j$=44.85 [mm] are substituted into the above formula (3). There is the same relation, between length L and inclination angle θ, as formula (1) which is true between the above-mentioned length $L_{211}$ and inclination angle $\theta_0$, and t in the formula (1) can be calculated by subtracting r from R, it can be therefore finally calculated by using the above formulas (1) and (3) so that θ=3.45 degrees.

Moreover, by the above parameters and the formulas (1) to (3), stratabound-direction stress Ex can be obtained by following formula (4). Incidentally, correlation between stratabound-direction stress Ex and x will be described while normalizing stratabound-direction stress Ex in FIG. 5 so that it becomes one(1) at the tip portion (x=0) of the taper shape portion. In other words, in following formula (4), coefficient A is defined so that y=r and Ex=1 when x=0. Therefore, A·sin θ/r=1.

[Formula 4]

$$E_x = \frac{A \cdot \sin\theta}{y} \tag{4}$$

Figure 6:
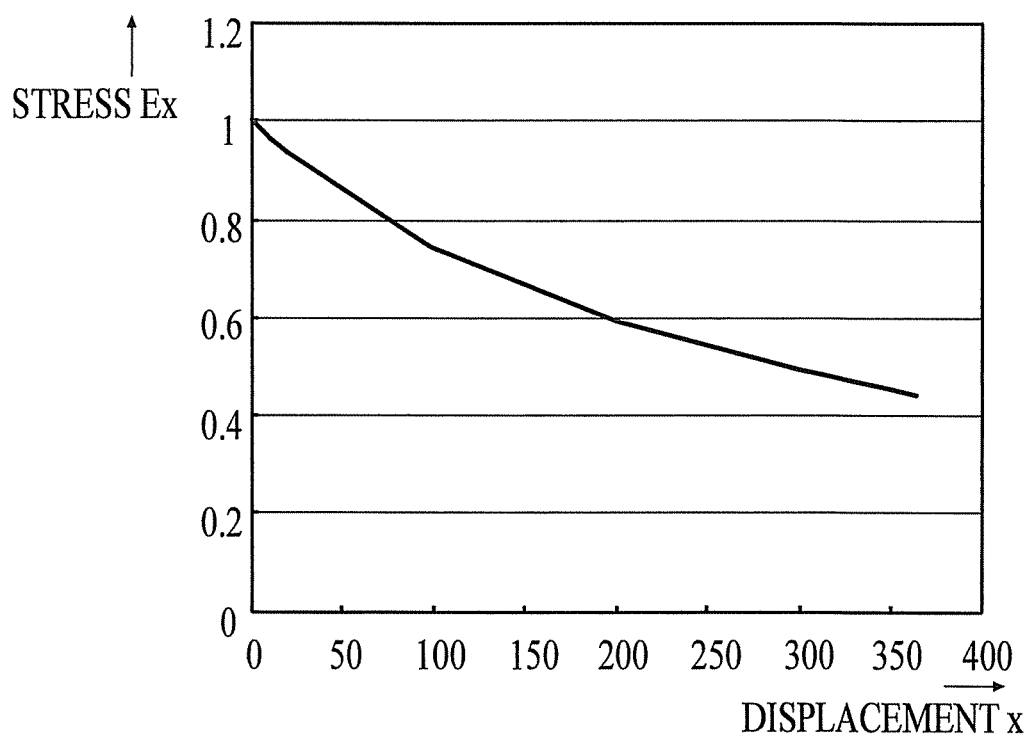
FIG. 6 is a diagram illustrating stress values in a stratabound direction at displacement X in the model of FIG. 5.

The relation between x and the value of stratabound-direction stress Ex in formula (4) is illustrated in the diagram of FIG. 6 with x as the horizontal axis and stratabound-direction stress Ex as the vertical axis. According to FIG. 6, it can be understood that the largest stress occurs at the tip portion (x=0) of the taper shape portion 21X on the outer periphery of the conductor layer 14X.

On the other hand, because it is essential to cool the cable core 11 with the cooling medium circulating in the insulation tube 12 and large thermal expansion/contraction of the former 13 and superconducting conductor layer 14 occurs in the radial direction due to cooling, a gap is made between the tip portion of the taper shape portion 21 having the insulating-paper-laminated, structure and the superconducting conductor layer 14, and it is therefore actually difficult to stably obtain the insulation strength just as calculated.

For this reason, in the superconducting cable 10 according to this embodiment, inclination angles $\alpha_1, \alpha_2, \alpha_3$ of the first to third tapered portions 211, 212, 213 of each taper shape portion 21 of the electric insulating layer 20 are set so as to become smaller toward the inner side ($\alpha_1 < \alpha_2 < \alpha_3$).

Furthermore, the inclination angle $\alpha_1$ of the innermost first tapered portion 211 is set so that $\alpha_1 < \theta$.

Here, stratabound-direction stress Ex in the first tapered portion 211 can be obtained by replacing θ with $\alpha_1$ to $\alpha_3$ in formula (4), and according to this, it is possible to obtain the smaller stratabound-direction stress Ex by making $\alpha_1$ to $\alpha_3$ smaller.

Next, a method for winding the insulating paper in order to form each of the tapered portions 211, 212, 213 so that it has an arbitrary inclination angle.

Figure 7:
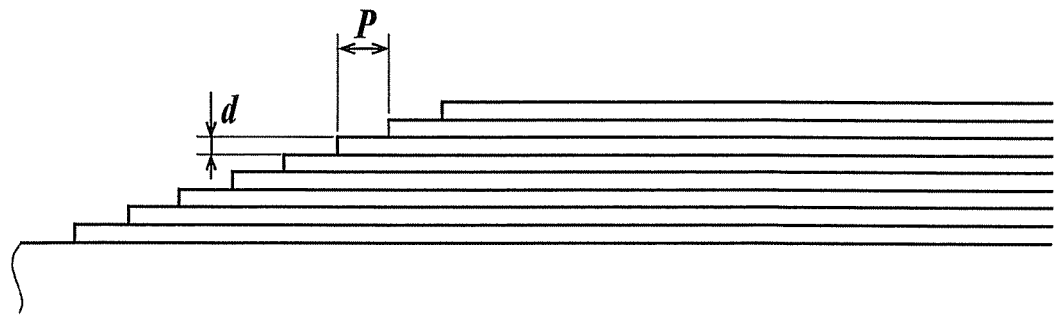
FIG. 7 is a diagram illustrating that the inclination angle of the taper shape portion is set depending on a step width of insulating paper.

In order to form the first tapered portion 211 (the same can be said for 212, 213), as illustrated in FIG. 7, the end of each layer of the wound insulating paper is adjusted so as to be shifted by a certain step width P so that the entire first tapered portion 211 has target inclination angle $\alpha_1$. Concretely, when the thickness of the insulating paper is defined as d, the step width P and the thickness d of the insulating paper are selected so that $\tan\alpha_1 = d/P$ is true among inclination angle $\alpha_1$ of the first tapered portion 211, step width P, and thickness d of the insulating paper.

Figure 8:
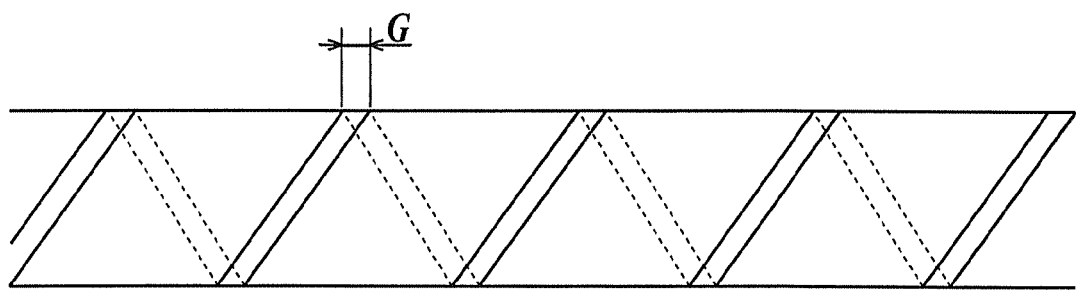
FIG. 8 is a diagram for illustrating a way to wind the insulating paper which forms an electric insulating layer.

Meanwhile, as illustrated in FIG. 8, the electric insulating layer 20 is formed by repeating, for the respective layers, winding the belt-like insulating paper having a predetermined width spirally on the outer periphery of the superconducting conductor layer 14 while making a gap so that the wound insulating paper does not overlap. For example, the insulating paper having the width of about 20 to 30 mm is wound with gap width G so that G=1 to 3 mm.

In the case that the electric insulating layer 20 is formed in such a way, it is preferable to set the step width P of the insulating paper to be equal to the gap width G or less, because if the above-described step width P is larger than the gap width G, the inner insulating paper cannot be efficiently pressed down in the tapered section 211.

For example, in the case that the gap width G of the insulating paper is set so that G=3 [mm] and each step width P of all of the first to third tapered portion 211, 212, 213 is 3 [mm] which is the allowable maximum value, the inclination angle of each of the tapered portions 211, 212, 213 is adjusted by changing thickness d of the insulating paper. The result of setting the thicknesses d of the insulating paper to 120, 170, 220 [μm] for the tapered portions 211, 212, 213, respectively, is that inclination angles $\alpha_1$, $\alpha_2$, $\alpha_3$ are obtained so that $\alpha_1$=2.3 degrees, $\alpha_2$=3.3 degrees, and $\alpha_3$=4.2 degrees.

$\theta$ is unambiguously obtained from required destruction strength $g_x$, and the size of each portion of the superconducting cable, for example, a standard size, and it varies depending on required destruction strength $g_x$ and/or the size of the superconducting cable.

Figure 9:
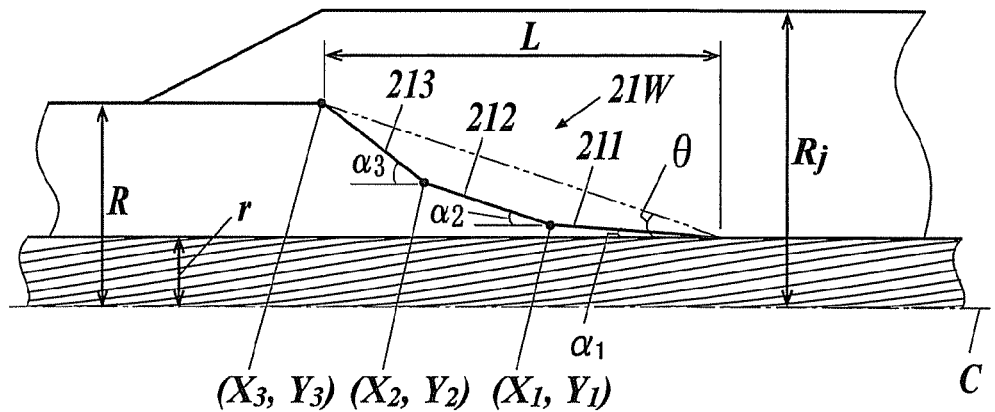
FIG. 9 is a diagram illustrating a model of the taper shape portion including the varied inclination angles.

Here, the model of the taper shape portion 21W whose inclination angle changes in a stepwise fashion by the first to third tapered portions 211, 212, 213, in which the equal diameter portions 214, 213 are not considered, is illustrated in FIG. 9. The set values of the respective parameters are same as those of FIG. 5.

The inclination angles are set so that $\alpha_1$=2.3 degrees, $\alpha_2$=3.3 degrees, and $\alpha_3$=4.2 degrees ($\theta$=3.45 degrees). Moreover, in x-y coordinate system in which the direction along the cable centerline C is defined as x and the cable radial direction centered on the cable centerline C is defined as y, when defining the tip portion (minimum diameter portion) of the taper shape portion 21W as an origin in x direction and defining the cable centerline C as an origin in y direction, a changeover point (maximum diameter portion of the first tapered portion 211) between the first tapered portion 211 and the second tapered portion 212 is defined as $(X_1, Y_1)$, a changeover point (maximum diameter portion of the second tapered portion 212) between the second tapered portion 212 and the third tapered portion 213 is defined as $(X_2, Y_2)$, and a rear end (maximum diameter portion) of the third tapered portion 213 is defined as $(X_3, Y_3)$.

In this case, $\alpha_1 < \theta$ is true, and $\alpha_2$ and $\alpha_3$ are determined so as to fulfill following formula (5).

[Formula 5]

$$\frac{A \cdot \sin\alpha_1}{y} < 1 \, (r \leq y < Y_1), \quad (5)$$

$$\frac{A \cdot \sin\alpha_2}{y} < 1 \, (Y_1 \leq y < Y_2),$$

$$\frac{A \cdot \sin\alpha_3}{y} < 1 \, (Y_2 \leq y < Y_3)$$

WHERE $$\frac{A \cdot \sin\theta}{r} = 1$$

Figure 5:
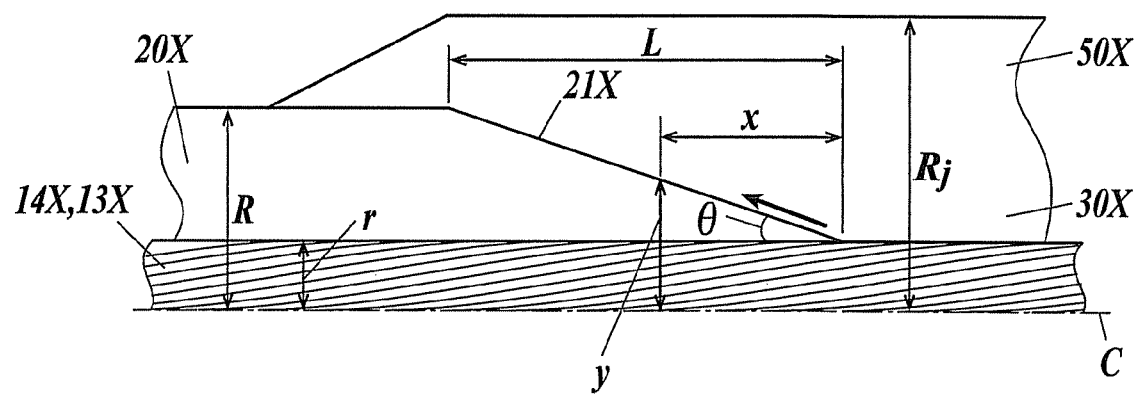
FIG. 5 is a diagram illustrating a model of a conventional taper shape portion.

The boundary positions of the tapered portions 211, 212, 213 in the taper shape portion 21W and the rear end portion of the taper shape portion 21W are set so that $X_1$=100, $X_2$=190, $X_3$=365, respectively, and length L of the taper shape portion 21W in the cable longitudinal direction is set to be equal to the case of FIG. 5.

Figure 10:
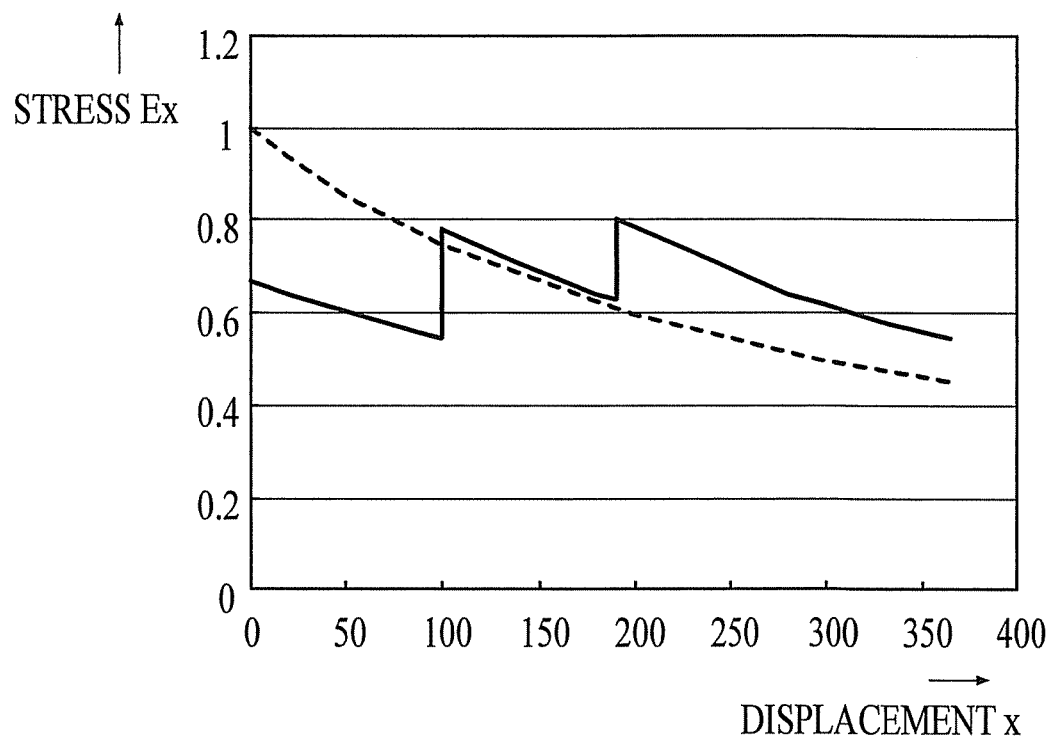
FIG. 10 is a diagram illustrating stress values in a stratabound direction at displacement X in the model of FIG. 9.

A diagram illustrating the relation between displacement x and the value of stratabound-direction stress Ex in the taper shape portion 21W with displacement x as the horizontal axis and stratabound-direction stress Ex as the vertical axis is illustrated in FIG. 10. In FIG. 10, the model of FIG. 5 is illustrated with a broken line, and the model of FIG. 9 is illustrated with a continuous line.

Thus, it is found that as a result of changing the inclination angle by three steps in the taper shape portion 21W, the stratabound-direction stress at the tip portion of the first tapered portion 211, at which resistance to stress is predicted to decrease most, is reduced by 30% or more in comparison with the conventional taper shape portion 21X having entirely constant inclination angle $\theta$. It is also found that the maximum value of the stratabound-direction stress in the entire taper shape portion 21W is reduced by 20%.

Incidentally, length L of the taper shape portion 21W in the cable longitudinal direction can be made shorter. In this case, it is only necessary to make $X_1, X_2, X_3$ smaller than the above values respectively within the range fulfilling the formula (5).

Figure 11:
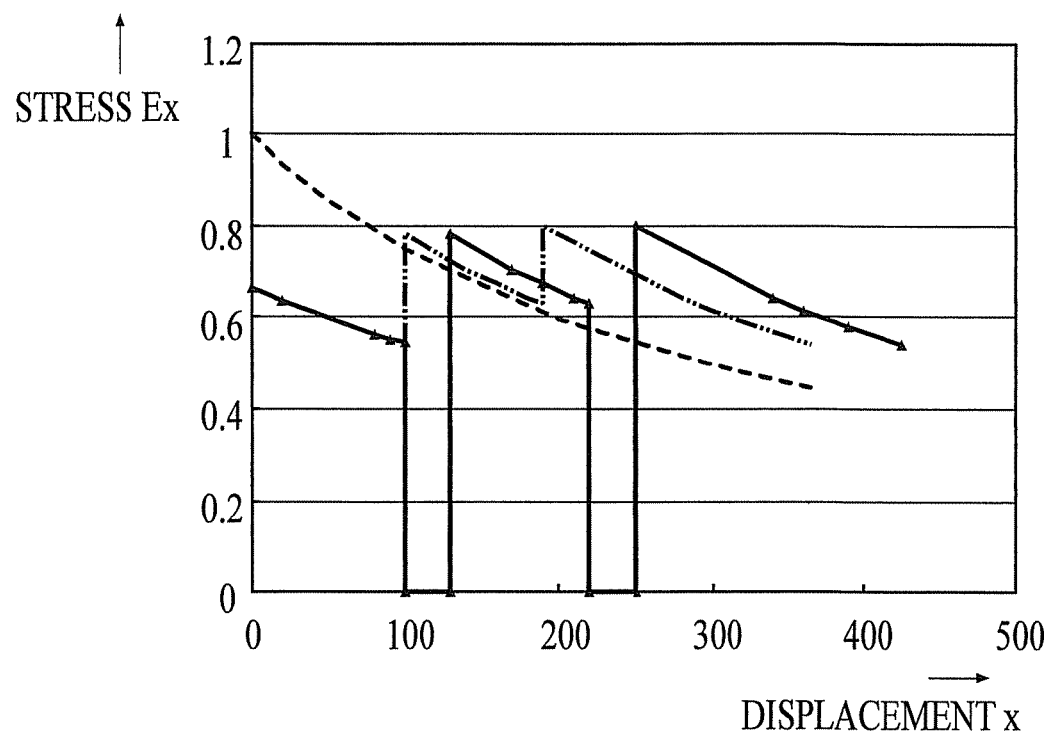
FIG. 11 is a diagram illustrating stress values in a stratabound direction at displacement X in the model in which step portions (equal diameter portions) are provided.

Furthermore, a diagram illustrating correlation between displacement x and stratabound-direction stress Ex in the taper shape portion 21 including the above-described first and second equal diameter portions 214, 215 is illustrated in FIG. 11.

In this case, the length of each of the equal diameter portions 214, 215 in the cable longitudinal direction is set to 20 [mm] or more, more preferably, 30 [mm] or more. In this regard, however, because the entire taper shape portion 21 becomes long when the equal diameter portions 214, 215 are made long, and as a result the entire intermediate connecting part grows in size, the length of each of the equal diameter portions 214, 215 is set to 100 [mm] or less, and more preferably, 50 [mm] or less, in the case that there is a size limit.

In the example of FIG. 11, each of the equal diameter portions is set to 30 [mm]. Incidentally, for comparison, the model of FIG. 5 is illustrated with a broken line, the model of FIG. 9 is illustrated with a two-dot chain line, and characteristics of the taper shape portion 21 is illustrated with a continuous line.

In the case of taper shape portion 21, the equal diameter portions 214, 215 do not share the stratabound-direction stress because the outer peripheries thereof do not incline, and the value of stratabound-direction stress Ex in regions of the equal diameter portions 214, 215 becomes zero(0). Moreover, the entire length of the taper shape portion 21 becomes longer by the lengths of the equal diameter portions 214, 215. Furthermore, the values of stratabound-direction stresses in the tapered portions 211, 212, 213 become same as the values in the tapered portions 211, 212, 213 of the taper shape portion 21W, respectively.

Second Embodiment

Figure 12:
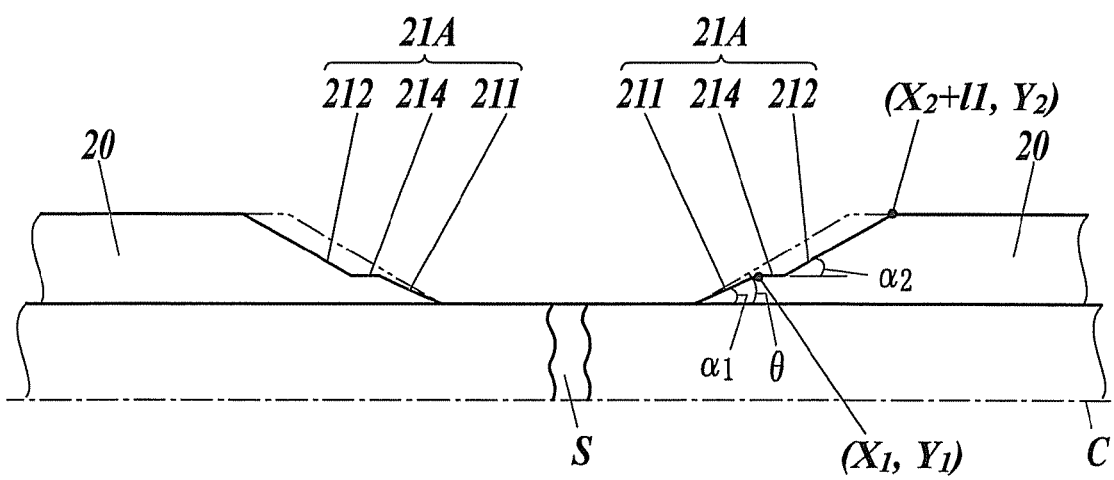
FIG. 12 is a cross-sectional view illustrating a state that formers and superconductive conductor layers are connected to each other and first and second reinforcing insulating portions are incomplete in a second embodiment.

Although the taper shape portion 21 of the first embodiment is composed of three tapered portions 211, 212, 213, it can be composed of a greater number of tapered portions, or composed of a smaller number, two, of tapered portions. In a second embodiment, as illustrated in FIG. 12, the case that each taper shape portion 21A includes the first tapered portion 211, the second tapered portion 212, and the first equal diameter portion 214 will be described. Also in this case, inclination angle $\alpha_1$ of the first tapered portion 211, inclination angle $\alpha_2$ of the second tapered portion 212, and inclination angle $\theta$ of a conventional taper shape portion including a single tapered surface are set so that $\alpha_1 < \alpha_2$, $\alpha_1 < \theta$, and $\alpha_2 > \theta$. Specifically, they are set so that $\alpha_1 = 2.3$, $\alpha_2 = 4.2$ ($\theta = 3.45$ degrees).

Moreover, in the case that the equal diameter portion 214 is not considered, in x-y coordinate system in which the direction along the cable centerline C is defined as x and the cable radial direction centered on the cable centerline C is defined as y, when defining the tip portion (minimum diameter portion) of the taper shape portion 21A as an origin in x direction and defining the cable centerline C as an origin in y direction, a changeover point (maximum diameter portion of the first tapered portion 211) between the first tapered portion 211 and the second tapered portion 212 is defined as $(X_1, Y_1)$, and a rear end (maximum diameter portion) of the second tapered portion 212 is defined as $(X_2, Y_2)$.

Incidentally, because FIG. 12 illustrates the case of including the equal diameter portions 214, the coordinate of the rear end of the second tapered portion 212 becomes $(X_2+l1, Y_2)$. l1 is a length of the equal diameter portion 214 in X direction.

$X_1$ and $\alpha_2$ are determined so as to fulfill following formula (6). For example, because r is set so that $r=17.7$, $X_1$ can be set so that $X_1 > 96$.

[Formula 6]

$$\frac{A \cdot \sin\alpha_1}{y} < 1 (r \leq y < Y_1),$$

$$\frac{A \cdot \sin\alpha_2}{y} < 1 (Y_1 \leq y < Y_2),$$

WHERE $$\frac{A \cdot \sin\theta}{r} = 1$$

(6)

While setting boundary position $X_1$ between the tapered portions 211, 212 in the taper shape portion 21A so that $X_1=140$, the length (overall length of the first tapered portion 211 and the second tapered portion 212) of the taper shape portion 21A in the cable longitudinal direction when not considering the equal diameter portion 214 is set so as to be equal to the case of FIG. 5. Incidentally, the length in the cable longitudinal direction becomes shorter when $X_1$ is less than 140, and the length in the cable longitudinal direction becomes longer when $X_1$ is larger than 140.

Figure 13:
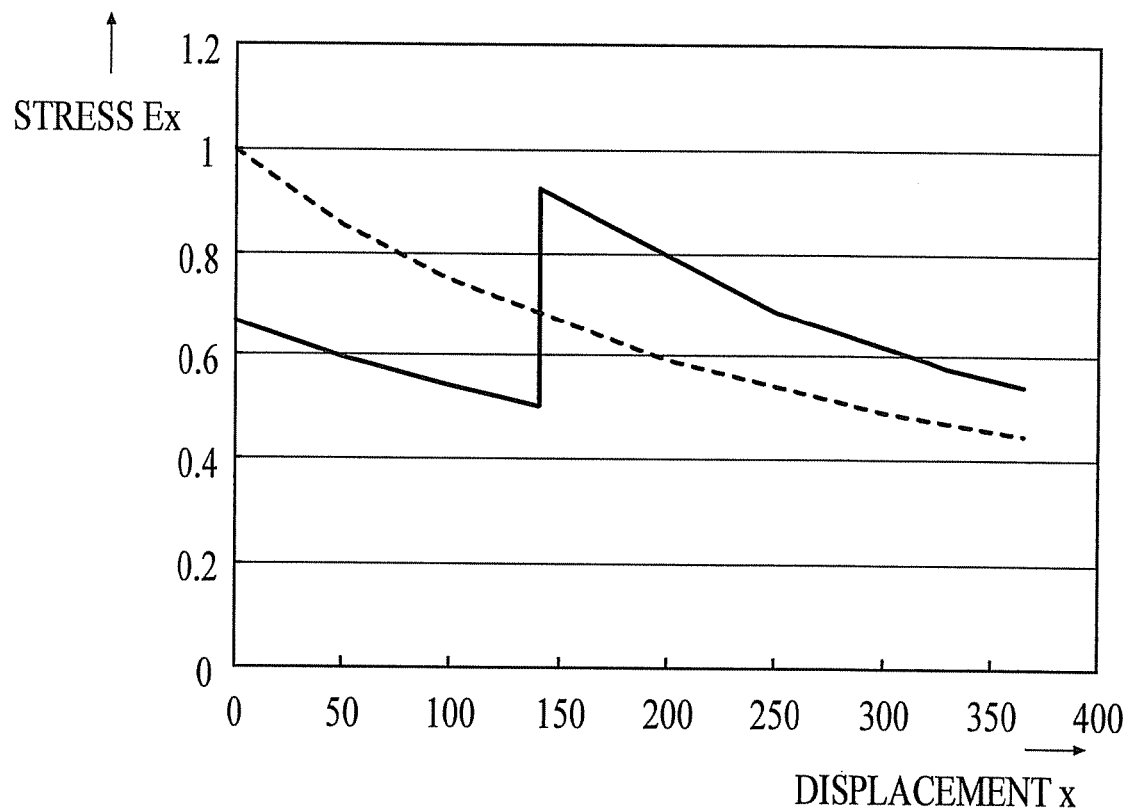
FIG. 13 is a diagram illustrating stress values in a stratabound direction at displacement X in the case that no step portion (no equal diameter portion) is provided in the model of FIG. 12.

Here, a diagram illustrating the relation between displacement x and the value of stratabound-direction stress Ex in the model of the taper shape portion 21A in which the equal diameter portion 215 is not considered is illustrated in FIG. 13, with displacement x as the horizontal axis and stratabound-direction stress Ex as the vertical axis. In FIG. 13, the model of FIG. 5 is illustrated with a broken line.

Thus, it is found that as a result of changing the inclination angle by two steps in the taper shape portion 21A, the stratabound-direction stress at tip portion of the first tapered portion 211, at which resistance to stress is predicted to decrease most, is reduced by 30%, or more in comparison with the conventional taper shape portion 21X having entirely constant inclination angle $\theta$.

Moreover, though the position at which the stratabound-direction stress has the maximum value is moved to the boundary between the first tapered portion 211 and the second tapered portion 212, because this position is far away from the superconducting conductor layer 14, it is less influenced by contraction at the time of cooling and insulation performance is not lowered, and thereby electrical breakdown is avoided.

Figure 14:
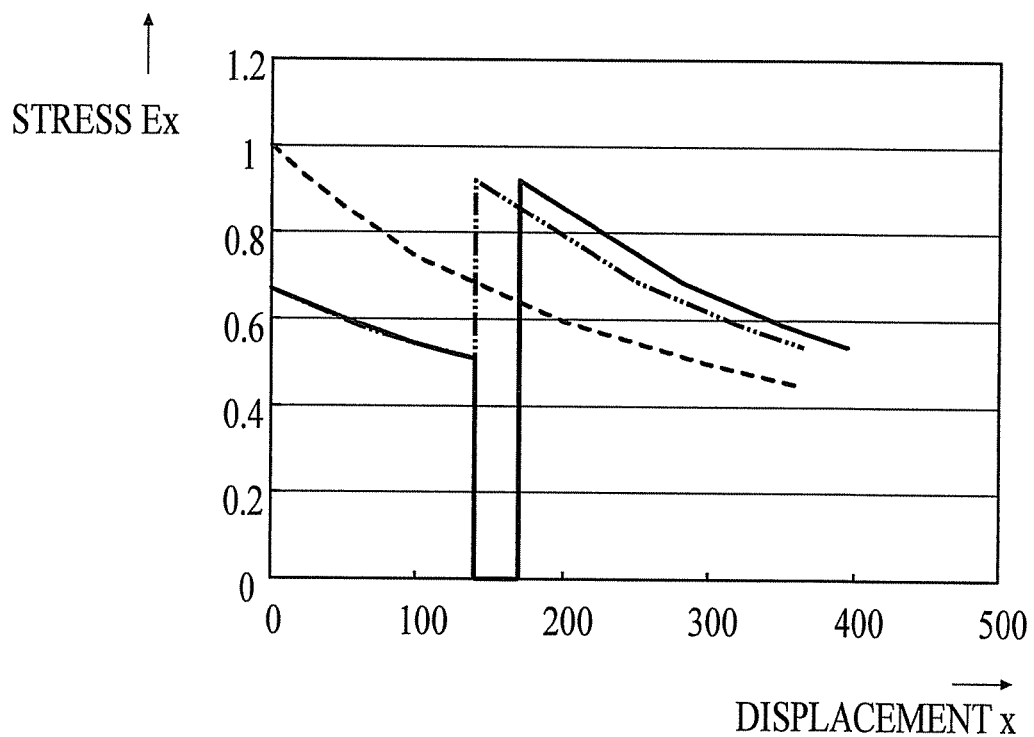
FIG. 14 is a diagram illustrating stress values in a stratabound direction at displacement X in the model of FIG. 12 in which a step portion (equal diameter portion) is provided.

Furthermore, a diagram illustrating the relation between displacement x and the value of stratabound-direction stress Ex in the model of the taper shape portion 21A in which the equal diameter portion 214 is considered is illustrated in FIG. 14, with displacement x as the horizontal axis and stratabound-direction stress Ex as the vertical axis. In FIG. 14, the model of FIG. 5 is illustrated with a broken line, and the model when not considering the equal diameter portion 214 is illustrated with a two-dot chain line.

Also in this case, the length of the equal diameter portion 214 in the cable longitudinal direction is set to 20 [mm] or more, more preferably 30 [mm] or more, and 100 [mm] or less, more preferably 50 [mm] or less.

In the example of FIG. 14, the equal diameter portion 214 is set to 30 [mm]. Incidentally, for comparison, the model of FIG. 5 is illustrated with a broken line, the model of FIG. 13 is illustrated with a two-dot chain line, and characteristics of the taper shape portion 21A is illustrated with a continuous line.

Also in the case of the taper shape portion 21A, the value of stratabound-direction stress Ex in the region of the equal diameter portions 214 becomes zero(0). Moreover, the overall length of the taper shape portion 21 becomes longer by the length of the equal diameter portion 214. Furthermore, the values of the stratabound-direction stresses in the tapered portions 211, 212 indicate the same values as the case that the equal diameter portion 214 is not provided.

Third Embodiment

Figure 15:
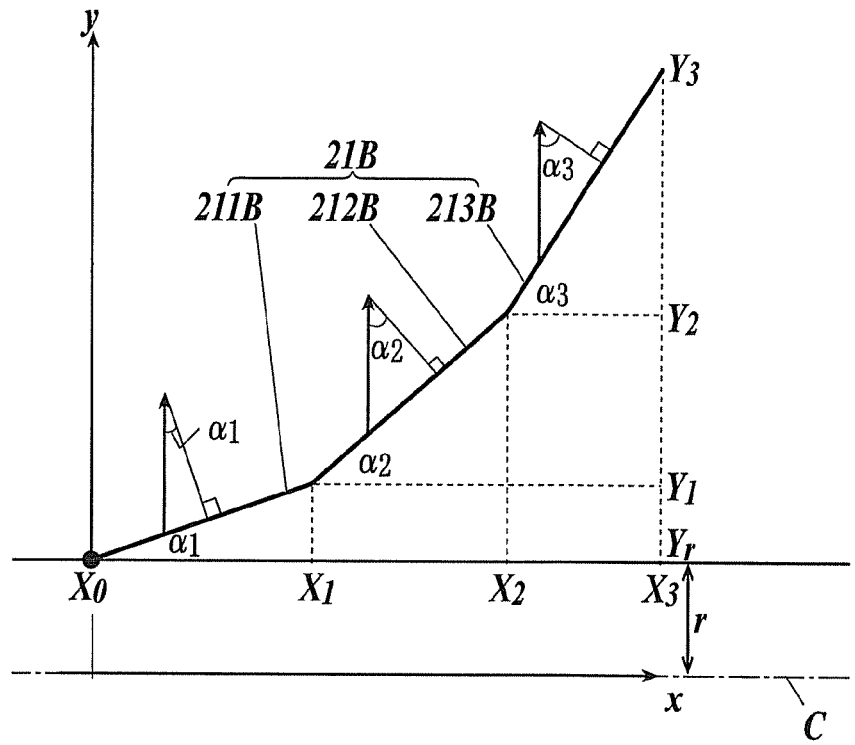
FIG. 15 is a diagram illustrating a model of the taper shape portion having a predetermined structure in a third embodiment.

In a third embodiment, as illustrated in FIG. 15, the taper shape portion 21B has the feature of being composed of a plurality (for example, n) of the first to $n^{th}$ stepwise tapered portions 211B, 212B, 213B, . . . , and having inclination angles $\alpha_1$ to $\alpha_n$ of the first to $n^{th}$ tapered portions 211B, 212B, 213B, . . . set so as to fulfill following condition formulas (7) to (12).

Incidentally, though the case that no equal diameter portion (no step portion) is provided at boundaries between the tapered portions is illustrated in the example of FIG. 15, it is also possible to provide the equal diameter portions (step portions). Additionally, in the case of providing the equal diameter portions (step portions), the overall length of the equal diameter portions (step portions) is added to each value of $X_2$ to $X_n$.

[Formula 7]

[FIRST STEP] (7)

$$\frac{A \cdot \sin\alpha_1}{y} < 1 \, (r \leq y < Y_1),$$

$$y = r + x \cdot \tan\alpha_1 \, (0 \leq x < X_1)$$

[SECOND STEP] (8)

$$\frac{A \cdot \sin\alpha_2}{y} < 1 \, (Y_1 \leq y < Y_2),$$

$$y = r + X_1 \tan\alpha_1 + (x - X_1)\tan\alpha_2 \, (X_1 \leq x < X_2)$$

[THIRD STEP] (9)

$$\frac{A \cdot \sin\alpha_3}{y} < 1 \, (Y_2 \leq y < Y_3),$$

$$y = r + X_1\tan\alpha_1 + (X_2 - X_1)\tan\alpha_2 + (x - X_2)\tan\alpha_3 \, (X_2 \leq x < X_3)$$

⋮

[Nth STEP] (10)

$$\frac{A \cdot \sin\alpha_1}{y} < 1 \, (Y_{n-1} \leq y < Y_n),$$

$$y = r + \sum_{K=1}^{n-1} (X_K - X_{K-1})\tan\alpha_K + (x - X_{n-1})\tan\alpha_n \, (X_{n-1} \leq x < X_n)$$

WHERE (11)

$$\frac{A \cdot \sin\alpha_1}{y} = 1$$

$$\theta = \tan^{-1}\left[(R-r) \cdot \frac{g_x}{V} \cdot \frac{\ln\left(\frac{Rj}{r}\right)}{\ln\left(\frac{R}{r}\right)}\right] \quad (12)$$

In FIG. 15, inclination angle $\alpha_1$ of the first tapered portion 211B nearest the center fulfills the condition of following formula (7), within the range from $X_0$ to $X_1$ of the first tapered portion 211B in the cable longitudinal direction, with the tip portion $(X_o, Y_r)$ of the taper shape portion 21B as a base point. Incidentally, in formula (7), coefficient A is defined by formula (11), and θ in formula (11) is defined by formula (12).

Concretely, R indicates a radius of the outer periphery of the electric insulating layer 20, r indicates a radius of the outer periphery of the superconducting conductor layer 14, $R_j$ indicates a radius of the outer periphery of the second reinforcing insulating layer 50, and θ indicates an inclination angle obtained from target withstand voltage V of the superconducting conductor layer 14, destruction strength $g_x$ of taper surface in the stratabound-direction, and the radius of each portion when hypothetically assuming that the taper shape portion 21B is made of a single tapered portion.

Moreover, x is a variable indicating a position on x axis (direction along the cable centerline C), and y is a variable indicating a position on y axis (direction along the cable radius direction). Furthermore, the tip position of the tapered portion 211B as the boundary between the superconducting conductor layer 14 and the first tapered portion 211B, as the first one, is defined as $(X_0, T_r)$, and the maximum diameter portion of each of subsequent tapered portions up to $n^{th}$ one is defined as $(X_n, Y_n)$.

In this case, inclination angle $\alpha_1$ is set so that the left-hand side of the left formula of formula (7) always becomes less than one(1) within the range from the tip portion of the taper shape portion 21B, which is of base point $(X_0, T_r)$, to $(X_1, Y_1)$.

In FIG. 15, inclination angle $\alpha_2$ of the second tapered portion 212B at the second position from the inner side fulfills the condition of following formula (8) within the range from $(X_1, Y_1)$ to $(X_2, Y_2)$.

In other words, inclination angle $\alpha_2$ is set so that the left-hand side of the left formula of formula (8) always becomes less than one(1) within the above range.

In the above, inclination angle $\alpha_3$ of the third tapered portion 213B at the third position from the inner side fulfills the condition of following formula (9) within the range from $(X_2, Y_2)$ to $(X_3, Y_3)$.

In other words, inclination angle $\alpha_3$ is set so that the left-hand side of the left formula of formula (9) always becomes less than one(1) within the above range.

Thus, though it is preferable to set the number of the tapered portions to two or three in the taper shape portion 21B, it is also possible to set it to more numbers (for example, n), and in such case, inclination angle $\alpha_n$ of the tapered portion 21nB at $n^{th}$ position from the inner side fulfills the condition of general formula (10) within the range from $(X_{n-1}, Y_{n-1})$ to $(X_n, Y_n)$. In addition, inclination angle $\alpha_n$ is set so that the left-hand side of the left formula of formula (10) always becomes less than one(1) within the above range.

Figure 16:
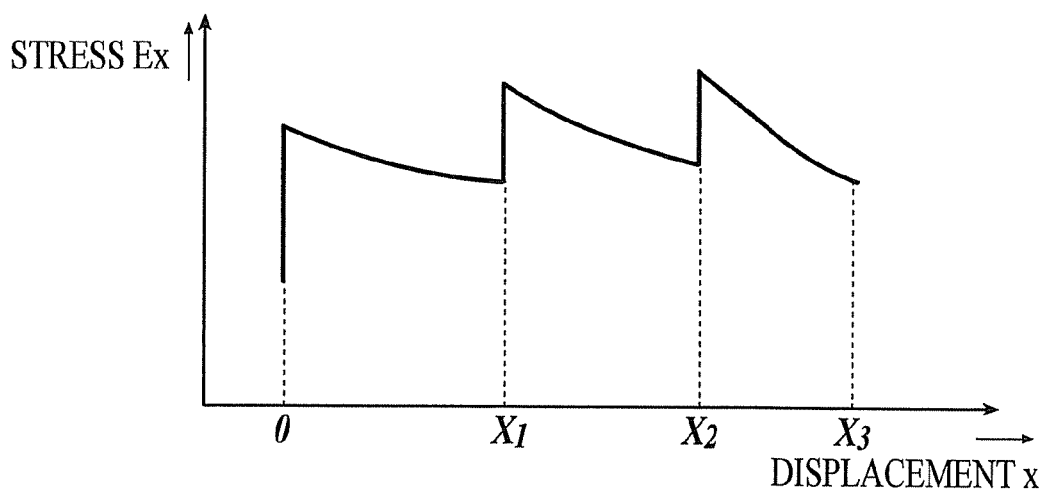
FIG. 16 is a diagram illustrating stress values in a stratabound direction at displacement X in the model of FIG. 15.
Figure 17:
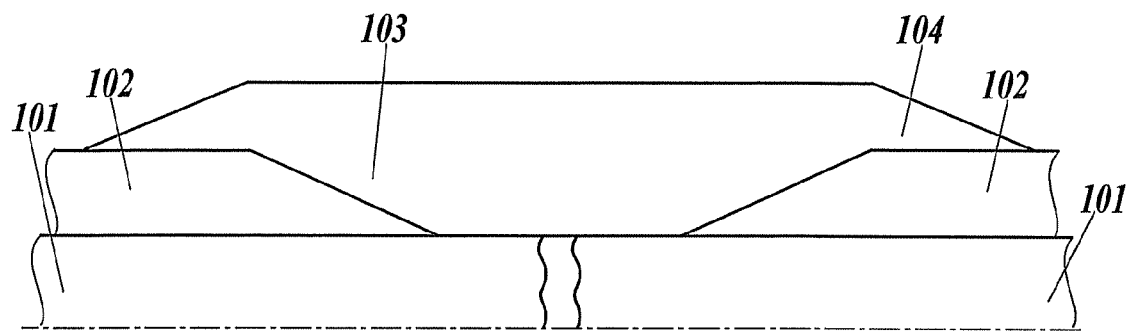
FIG. 17 is a diagram illustrating a cross-section structure of an intermediate connecting part of a conventional superconducting cable.

Thus, a diagram illustrating the relation between displacement x in the x axis direction and stratabound-direction stress Ex in the taper shape portion 21B, which is made of the plural tapered portions, is illustrated in FIG. 16, with the displacement x as a horizontal axis and stratabound-direction stress Ex as a vertical axis.

In the case of setting the inclination angles of the tapered portions so as to fulfill formulas (7) to (12) in the taper shape portion 21B, the stratabound-direction stress in each of the tapered portions 211B, 212B, 213B, . . . has the maximum value at the position at which the diameter of each of the tapered portions becomes minimum. In other words, it has the highest value at the boundary position between the tapered portion and another tapered portion adjacent thereto on the smaller diameter side.

Moreover, it is preferable that among the stratabound-direction stresses at boundary positions $(X_0, Y_r)$, $(X_1, Y_1)$, $(X_2, Y_2)$, $(X_3, Y_3)$ of the tapered portions 211B, 212B, 213B, . . . , the stratabound-direction stress at the tip portion of the innermost first tapered portion 211B has the minimum value, and such value can be obtained by controlling angles $\alpha_1, \alpha_2, \alpha_3, \ldots$ of the tapered portions.

In other words, in the examples of the boundary positions $(X_0, Y_r)$, $(X_1, Y_1)$, $(X_2, Y_2)$, it is required to satisfy the following condition.

$$A \cdot \sin\alpha_1/Yr < A \cdot \sin\alpha_2/Y_1 \text{ and } A \cdot \sin\alpha_1/Yr < A \cdot \sin\alpha_3/Y_2$$

Thus, it is found that the stratabound-direction stress at the tip portion of the first tapered portion 211B, at which resistance to stress is predicted to decrease most, can be sufficiently reduced.

Incidentally, either of above $A \cdot \sin\alpha_2/Y_1$ or $A \cdot \sin\alpha_3/Y_2$ may be larger. In this regard, however, it is more preferable that the values of the stratabound-direction stresses at the boundary positions $(X_0, Y_r)$, $(X_1, Y_1)$, $(X_2, Y_2)$ become lower in the order in which the tapered portions 211B, 212B, 213B are placed from the inner side.

In other words, in this case, the following condition is satisfied in each of boundary positions $(X_0, Y_r)$ $(X_1, Y_1)$, $(X_2, Y_2)$.

$$A \cdot \sin\alpha_1/Yr < A \cdot \sin\alpha_2/Y_1 < A \cdot \sin\alpha_3/Y_2$$

Technical Effects in the Embodiments

In each of the intermediate connecting parts of the above superconducting cable 10, the taper shape portions 21 are formed in the electric insulating layers 20 on both sides of the conductor connecting part S, respectively, and the taper shape portion 21 is made of the plurality of tapered portions so that the taper portion nearer the conductor connecting part S has the smaller inclination angle.

According to this, even at the tip portion of the taper shape portion 21 at which the insulating sheets are likely to get loose due to contraction when cooling the superconducting conductor layer 14, stratabound-direction components of electrical field stress can be reduced, and thereby it becomes possible to prevent electrical breakdown from occurring in the stratabound direction.

Moreover, because the inclination angle of the taper shape portion 21 becomes larger in a stepwise fashion as it gets farther from the conductor connecting part, the overall length of the taper shape portion 21 does not become long and can be shortened, therefore the intermediate connecting part can be downsized, the workload necessary for forming it and/or production time can be reduced.

Furthermore, because the taper shape portion 21 includes the equal diameter portion 214 or 215, it has high adhesiveness when further winding the insulating paper around the outer periphery thereof, and insulation performance at the boundary between the taper shape portion 21 and the first reinforcing insulating layer 30 can be prevented from being lowered, and thereby it becomes possible to provide the connection structure having excellent insulation performance.

Additionally, when performing grading for the tapered portions 211, 212, 213 by using insulating paper thinner in thickness for the layer nearer the inside, construction of the tapered portions 211, 212, 213 becomes easier and insulation performance is further improved. This is because it becomes possible to make the step width constant for maintaining the slope angle constant, and adhesiveness to the insulating paper filling the valley portion becomes good.

INDUSTRIAL APPLICABILITY

Industrial applicability exists in the fields of connection structure for superconducting cables in which good endurance to electrical field stress is required.

DESCRIPTION OF REFERENCE NUMERALS

10 Superconducting cable
12 Thermal insulation tube
13, 13X Former
14, 14X Superconducting conductor layer
20, 20X Electric insulating layer
21, 21A, 21W, 21X Taper shape portion
30 First reinforcing insulating layer
31, 34, 35, 39, 40, 41 divided layers (wide-width insulating layer)
32, 33, 36, 37, 38, 42, 43, 44, 45 divided layers (narrow-width insulating layer)
50, 50X Second reinforcing insulating layer
211 First tapered portion (tapered portion)
212 Second tapered portion (tapered portion)
213 Third tapered portion (tapered portion)
214 First equal diameter portion (step portion)
215 Second equal diameter portion (step portion)
Ex Stratabound-direction stress
S Conductor connecting part
$\alpha_1, \alpha_2, \alpha_3$ Inclination angle
$\theta$ Inclination angle

The invention claimed is:

1. A connection structure for superconducting cables comprising:
    superconducting cables that are connected to each other and include cable cores containing formers and superconducting conductor layers, respectively, and each of the cable cores is housed in a thermal insulation tube with a cooling medium, wherein
    the cable cores include electric insulating layers obtained by winding insulating sheets around the superconducting conductor layers, respectively,
    the electric insulating layers on both sides of a conductor connecting part, in which the formers and the superconducting conductor layers are connected to each other, include taper shape portions each having a diameter reducing towards the conductor connecting part,
    each of the taper shape portions is formed so as to have an inclination angle changing in a stepwise fashion by a plurality of tapered portions among which a tapered portion nearer the conductor connecting part has smaller inclination angle, and
    a reinforcing insulating layer is provided between the taper shape portions, wherein when a tapered portion nearest the conductor connecting part among the tapered portions of the taper shape portion is defined as a first one, inclination angles $\alpha_1$ to $\alpha_n$ of the tapered portions from first one to $n^{th}$ one fulfill a condition of the following formula,

[Formula 8]

[FIRST STEP] (7)
$$\frac{A \cdot \sin\alpha_1}{y} < 1 (r \leq y < Y_1),$$
$$y = r + x \cdot \tan\alpha_1 (0 \leq x < X_1)$$

[SECOND STEP] (8)
$$\frac{A \cdot \sin\alpha_2}{y} < 1 (Y_1 \leq y < Y_2),$$
$$y = r + X_1 \tan\alpha_1 + (x - X_1)\tan\alpha_2 (X_1 \leq x < X_2)$$

[THIRD STEP] (9)
$$\frac{A \cdot \sin\alpha_3}{y} < 1 (Y_2 \leq y < Y_3),$$
$$y = r + X_1 \tan\alpha_1 + (X_2 - X_1)\tan\alpha_2 + (x - X_2)\tan\alpha_3 (X_2 \leq x < X_3)$$

⋮

[$Nth$ STEP] (10)
$$\frac{A \cdot \sin\alpha_1}{y} < 1 (Y_{n-1} \leq y < Y_n),$$
$$y = r + \sum_{K=1}^{n-1} (X_K - X_{K-1})\tan\alpha_K + (x - X_{n-1})\tan\alpha_n (X_{n-1} \leq x < X_n)$$

WHERE (11)
$$\frac{A \cdot \sin\alpha_1}{y} = 1$$

$$\theta = \tan^{-1}\left[(R-r) \cdot \frac{g_x}{V} \cdot \frac{\ln\left(\frac{R_j}{r}\right)}{\ln\left(\frac{R}{r}\right)}\right] \quad (12)$$

wherein R is a radius of an outer periphery of the electric insulating layer, r is a radius of an outer periphery of the superconducting conductor layer, $R_j$ is a radius of the outer periphery of the reinforcing insulating layer, $\theta$ is an inclination angle obtained from target withstand voltage V of the superconducting conductor layer, destruction strength $g_x$ of a taper surface in the stratabound-direction, and values of above R, $R_j$ and r when assuming that the taper shape portion is made of a single tapered portion, x is a variable indicating a position on a line along a cable longitudinal direction with a tip portion of the taper shape portion as an origin, y is a variable indicating a position on a line towards outside in a radius direction with a cable centerline as an origin, and $X_{1\ to\ n}$ and $Y_{1\ to\ n}$ are positional coordinates of maximum diameters of the tapered portions from the first one to $n^{th}$ one on a plane with x-y coordinate system.

2. The connection structure for superconducting cables according to claim 1, wherein each of the taper shape portions includes a step portion whose outer diameter is constant, at a boundary position between the tapered portions having inclination angles that change in a stepwise fashion.

3. The connection structure for superconducting cables according to claim 2, wherein
the reinforcing insulating layer is composed of a plurality of layers which are laminated in order from an inner side, and each of the layers is formed by winding the insulating sheet until an outer diameter of each of the layers becomes same as the outer diameter of the step portion, and
each of the layers laminated in order is formed by winding the insulating sheet so as to cover a boundary between a layer positioned on the inner side among the laminated layers and the step portion having the same outer diameter as the outer diameter of the inner side layer.

4. The connection structure for superconducting cables according to claim 2, wherein
the reinforcing insulating layer is composed of a plurality of layers which are laminated in order from the inside, and each of the layers is composed of an insulating layer having a wide width in a longitudinal direction of the superconducting cable and an insulating layer having a narrow width and fulfilling gaps existing on both sides of the wide-width insulating layer, and
the wide-width insulating layer is formed so as to cover an entire outer periphery of the narrow-width insulating layer positioned on the inner side.

5. The connection structure for superconducting cables according to claim 2, wherein a length of the step portion in a cable longitudinal direction is 20 [mm] or more but 100 [mm] or less.

6. The connection structure for superconducting cables according to claim 1, wherein the number n of the tapered portions is 2 or 3.

7. The connection structure for superconducting cables according to claim 1, wherein a maximum value among stratabound-direction stresses in the plurality of tapered portions arises in an outermost tapered portion among the tapered portions.

8. The connection structure for superconducting cables according to claim 7, wherein a value of stratabound-direction stress in a tip portion of each of the tapered portions becomes lower as each of the tapered portions is placed on inner side.

* * * * *